United States Patent
Cheng et al.

(10) Patent No.: US 9,105,663 B1
(45) Date of Patent: Aug. 11, 2015

(54) FINFET WITH SILICON GERMANIUM STRESSOR AND METHOD OF FORMING

(71) Applicants: International Business Machines Corporation, Armonk, NY (US); Renesas Electronics Corporation, Kanagawa (JP); STMicroelectronics, Inc., Coppell, TX (US)

(72) Inventors: Kangguo Cheng, Schenectady, NY (US); Ali Khakifirooz, Mountain View, CA (US); Nicolas Loubet, Guilderland, NY (US); Shogo Mochizuki, Tokyo (JP); Alexander Reznicek, Troy, NY (US); Raghavasimhan Sreenivasan, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 14/168,175

(22) Filed: Jan. 30, 2014

(51) Int. Cl.
*H01L 27/12* (2006.01)
*H01L 29/66* (2006.01)
*H01L 21/225* (2006.01)
*H01L 29/78* (2006.01)

(52) U.S. Cl.
CPC ...... *H01L 29/66795* (2013.01); *H01L 21/2254* (2013.01); *H01L 29/785* (2013.01); *H01L 29/7841* (2013.01); *H01L 29/7848* (2013.01)

(58) Field of Classification Search
CPC .............. H01L 21/845; H01L 21/2254; H01L 29/78648; H01L 29/7848; H01L 29/785; H01L 29/66787; H01L 29/42392; H01L 29/66628; H01L 29/66742; H01L 29/78687; H01L 29/78621

USPC ........................................... 257/347; 438/283
See application file for complete search history.

(56) References Cited

U.S. PATENT DOCUMENTS

| | | | |
|---|---|---|---|
| 8,274,132 B2 | 9/2012 | Russ et al. | |
| 8,399,314 B2 | 3/2013 | Cohen et al. | |
| 2010/0072549 A1* | 3/2010 | Usuda et al. | 257/347 |
| 2011/0024804 A1 | 2/2011 | Chang et al. | |
| 2011/0291188 A1 | 12/2011 | Cheng et al. | |
| 2012/0012932 A1* | 1/2012 | Perng et al. | 257/347 |
| 2012/0091528 A1* | 4/2012 | Chang et al. | 257/347 |
| 2012/0276695 A1 | 11/2012 | Cheng et al. | |
| 2012/0280211 A1 | 11/2012 | Cohen et al. | |
| 2012/0306002 A1 | 12/2012 | Yeh et al. | |
| 2013/0277752 A1* | 10/2013 | Glass et al. | 257/369 |

FOREIGN PATENT DOCUMENTS

| | | |
|---|---|---|
| IN | 2057/CHE/2007 A | 11/2009 |
| KR | 10-0596508 B1 | 7/2006 |

* cited by examiner

*Primary Examiner* — Trung Q Dang
(74) *Attorney, Agent, or Firm* — Joseph Petrokaitis; Hoffman Warnick LLC

(57) ABSTRACT

The present disclosure generally provides for a method of forming a FinFET with a silicon germanium (SiGe) stressor, in addition to a FinFET structure obtained from embodiments of the method. The method can include forming a semiconductor fin on a buried insulator layer; forming a gate structure on the semiconductor fin; forming a silicon germanium (SiGe) layer on the buried insulator layer, wherein the SiGe layer contacts the semiconductor fin; and heating the SiGe layer, wherein the heating diffuses germanium (Ge) into the semiconductor fin.

20 Claims, 6 Drawing Sheets

FINFET WITH SILICON GERMANIUM STRESSOR AND METHOD OF FORMING

BACKGROUND

Embodiments of the invention relate generally to fin-shaped field effect transistors (FinFETs) which may include silicon germanium (SiGe) stressors. More specifically, embodiments of the invention include a method of forming a FinFET with a SiGe stressor and a resulting FinFET structure.

In integrated circuit (IC) structures, a transistor is a critical component used to implement digital circuitry designs. Generally, a transistor includes three electrical terminals: a source, a drain, and a gate. By applying different voltages to the gate terminal, the flow of electric current from the source to the drain can be enabled or disabled. A common type of transistor is a metal oxide field effect transistor (MOSFET). One type of MOSFET design is known as a "FinFET," typically built upon a semiconductor-on-insulator (SOI) layer and buried insulator layer. A FinFET can be composed of a semiconductor structure etched into a "fin" shaped body, with one side of the fin acting as a source terminal and the other side of the fin acting as a drain terminal. A gate structure, typically composed of polysilicon and/or a metal, can be formed around one or more of the semiconductor fins. By applying a voltage to the gate structure, an electrically conductive channel can be created between the source and drain terminals of each fin in contact with the gate.

To enhance the operation of an IC, mechanical stress may be applied to the transistors of the circuit. For example, the operation of a p-type MOSFET is enhanced if a compressive stress is applied to its channel, while the operation of an n-type MOSFET is enhanced if a tensile stress is applied to its channel. To apply mechanical stress to an IC component composed of single-crystal semiconductor (e.g., the fins of a FinFET), a "stressor" material can be introduced to the component. Silicon germanium (SiGe), a conventional stressor used in MOSFETs and sometimes used in a FinFET, can be introduced, for example, by creating a recess within source and drain regions of the transistor and growing epitaxial silicon germanium (SiGe) therein. This conventional process of introducing a stressor material may be limited by the amount of semiconductor material (e.g., silicon) available in the recessed semiconductor fin. The various crystal growth conditions of SiGe, in some cases, can also create a faceted epitaxy at the bottom of the recess within the fin, which will prevent the application of strain to the semiconductor fin.

SUMMARY

According to one embodiment of the present invention, a method of forming a FinFET with a silicon germanium (SiGe) stressor can include: forming a semiconductor fin on a buried insulator layer; forming a gate structure on the semiconductor fin; forming a silicon germanium (SiGe) layer on the buried insulator layer, wherein the SiGe layer contacts the semiconductor fin; and heating the SiGe layer, wherein the heating diffuses germanium (Ge) into the semiconductor fin.

According to another embodiment of the present invention, a FinFET structure can include: a semiconductor fin positioned above a buried insulator layer, wherein the semiconductor fin includes: a semiconductor channel region; a silicon germanium (SiGe) source region positioned adjacent to the semiconductor channel region; and a silicon germanium (SiGe) drain region positioned adjacent to the semiconductor channel region, each stressor having a highest concentration of Ge along an exterior of the semiconductor fin, and a lowest concentration of Ge proximate to the semiconductor channel region.

According to an additional embodiment of the present invention, a method of forming a FinFET structure can include: forming a semiconductor fin on a buried insulator layer, wherein the semiconductor fin includes a source region and a drain region; forming a gate structure on the semiconductor fin; forming a spacer on the gate structure; growing a SiGe layer on the buried insulator layer, wherein the SiGe layer contacts the semiconductor fin; annealing the SiGe layer, wherein the annealing causes germanium (Ge) to diffuse from the SiGe layer into the semiconductor fin at each of the source region and the drain region; and removing the SiGe layer.

BRIEF DESCRIPTION OF THE SEVERAL VIEWS OF THE DRAWINGS

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the present disclosure include a method of forming a FinFET with a silicon germanium stressor. In addition, a FinFET structure obtainable from embodiments of the disclosed method, is discussed. The method can include, for example, forming a semiconductor fin on a buried insulator layer, and forming a gate structure on the semiconductor fin. A layer of silicon germanium (SiGe) can be formed on the buried insulator layer such that the formed SiGe layer contacts the semiconductor fin. The formed SiGe layer can be heated to a temperature at which germanium (Ge) diffuses into the semiconductor fin to form a SiGe stressor region.

Figure 1:
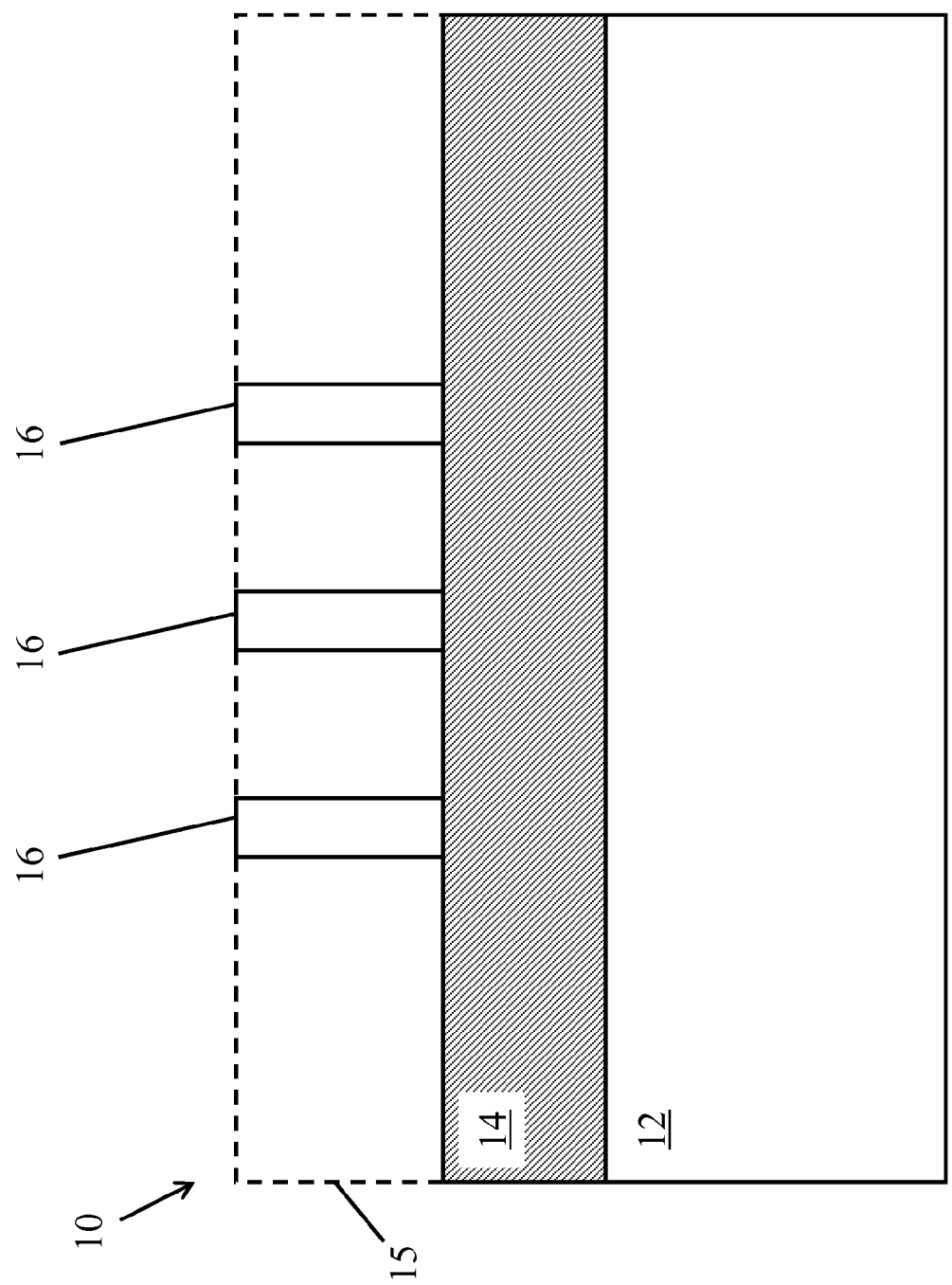
FIGS. 1-4 depict cross-sectional views of a substrate and buried insulator layer undergoing processes according to various embodiments of the present disclosure.

Referring to the drawings, FIG. 1 depicts a process according to an embodiment of the invention. An integrated circuit (IC) structure 10 may include a substrate 12. Materials used in the composition of substrate 12 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, semiconductor substrate 12 or a portion thereof may be strained. A buried insulator layer 14 can be formed on and positioned above substrate 12. Buried insulator layer 14 may be composed of any insulating material such as $SiO_2$ or a dielectric having a high dielectric constant, which may be, for example, above 3.9. In some situations, buried insulator layer 14 may be composed of an oxide substance, and correspondingly may be referred to as a buried oxide (BOX) layer. Materials appropriate for the composition of buried insulator layer 14 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later developed materials having similar properties.

A semiconductor layer 15 (shown in phantom) can be formed, e.g., by wafer bonding on buried insulator layer 14. "Wafer bonding" generally can refer to a process in which two semiconductor wafers are bonded together, forming a single substrate material. The bonded semiconductor wafers can be cut using any currently known or later developed semiconductor or SOI fabrication process. As one example, a semiconductor material can formed by implanting a bonded wafer with hydrogen and then annealing the wafer, causing it to split along the plane of the implanted hydrogen. Semiconductor layer 15 can, together with substrate 12 and buried insulator layer 14, form a semiconductor-on-insulator (SOI) structure. Semiconductor layer 15 can be composed of, for example, silicon or another semiconductor material. In some embodiments, semiconductor layer 15 can be composed of SiGe with a relatively small fraction of germanium, e.g., approximately twenty percent. Following the formation of semiconductor layer 15, one or more semiconductor fins 16 can be formed therefrom via any currently known or later developed process of removing a portion of a semiconductor material. As discussed herein, "removing" can include any one of various material removal or polishing techniques now known or later developed, e.g., etching, a reactive ion etch (RIE), etc. RIE" or "reactive ion etch" refers to a variation of plasma etching in which, during etching, a semiconductor wafer is placed on an RF powered electrode. Throughout RIE, the wafer may take on an electric potential which accelerates the etching species extracted from plasma toward the etched surface. Although three semiconductor fins 16 are shown in FIG. 1 are shown by way of example, a single FinFET structure can include only one semiconductor fin 16, or any desired greater number of semiconductor fins (e.g., five fins, ten fins, twenty fins, etc.)

Figure 2:
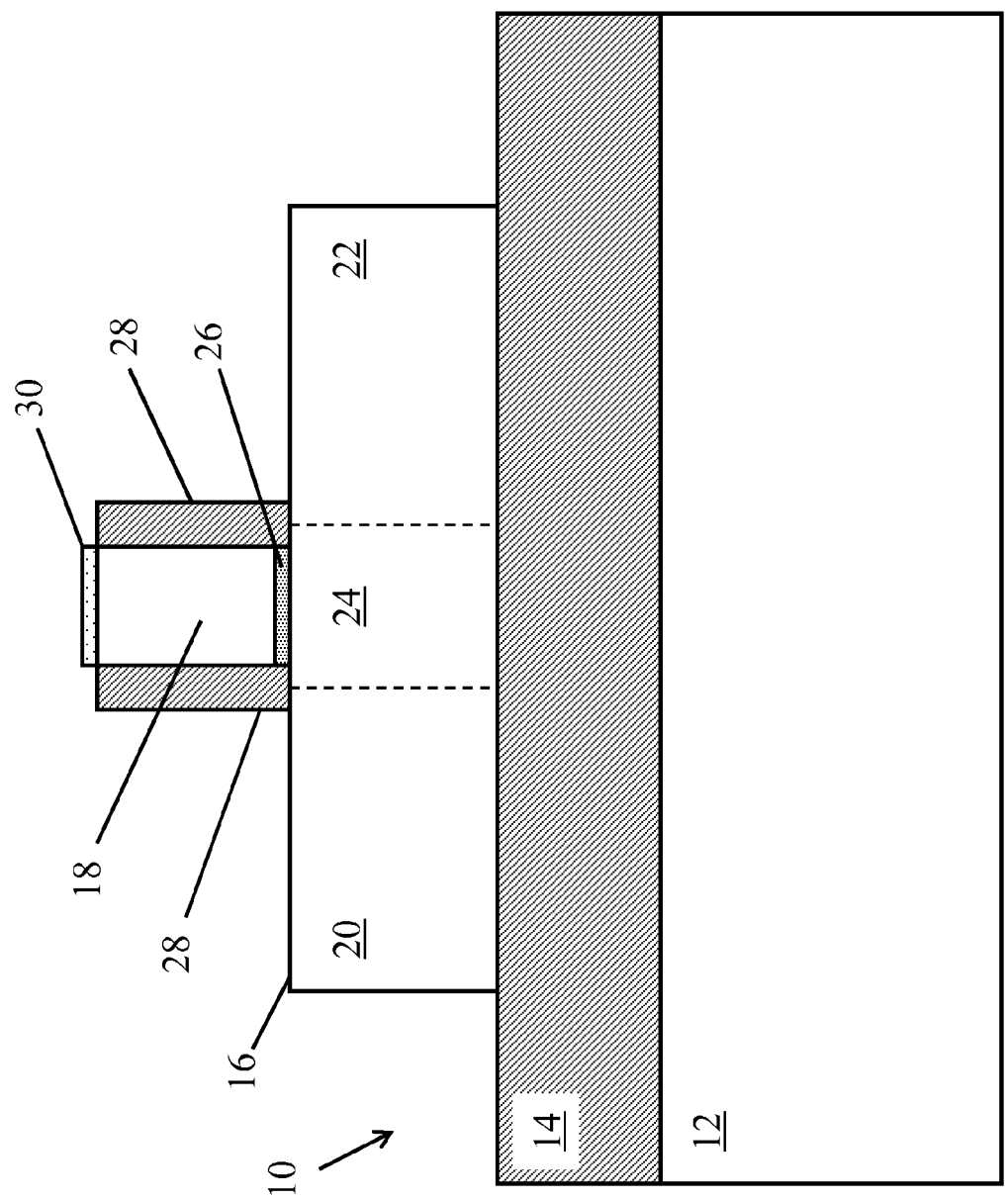

Turning to FIG. 2, a channel-oriented view of the structure shown in FIG. 1 is shown. As shown in FIG. 2, a gate structure 18 can be formed, e.g., by deposition or other currently known or later developed processes of forming discussed herein, above and/or around one or more of semiconductor fins 16. Gate structure 18 can be composed of a conductive material such as, e.g., polysilicon, a metal, or a silicide. Although not shown in the cross-sectional view of FIG. 2, gate structure 18 can be a continuous structure which effectively "wraps" around the surface of each semiconductor fin 16 and extends across the surface of buried insulator layer 14. In this way, the voltage of a single gate structure 18 can control the formation of a channel region within several semiconductor fins 16. The forming of gate structure 18 effectively defines a source region 20, a gate region 22, and a channel region 24 in contact with gate structure 18. In some embodiments, gate structure 18 can be composed of a placeholder material, which can be removed in a later fabrication process and then replaced with a functional gate material. Thus, gate structure 18 can form part of a working gate terminal, or can be used as an inoperative, electrically isolated "dummy" structure if desired.

A gate dielectric 26 may be formed, e.g., by deposition or any other currently known or later process of forming a dielectric material, between semiconductor fin 16 and gate structure 18. Gate dielectric 26 can be a thin insulator which may be composed of, e.g., thermally grown silicon oxide (sometimes nitrided), or other insulative materials having a higher dielectric constant than silicon oxide. One or more spacers 28 can be formed adjacent to gate structure 18, e.g., by being deposited. Spacers 28 can electrically isolate gate structure 18 from source region 20 and drain region 22 of semiconductor fin 16. Spacers 28 can be composed of, e.g., an insulating material such as a nitride or an oxide compound, including, for example, the various insulators discussed elsewhere herein. Additionally, a nitride cap 30 can be formed, e.g., by deposition, above gate structure 18. The material composition of spacers 28 and/or nitride cap 30 can prevent the diffusion of germanium (Ge) into gate structure 18 during the heating processes used to diffuse Ge into semiconductor fin 16, embodiments of which are described in detail elsewhere herein.

Figure 3:
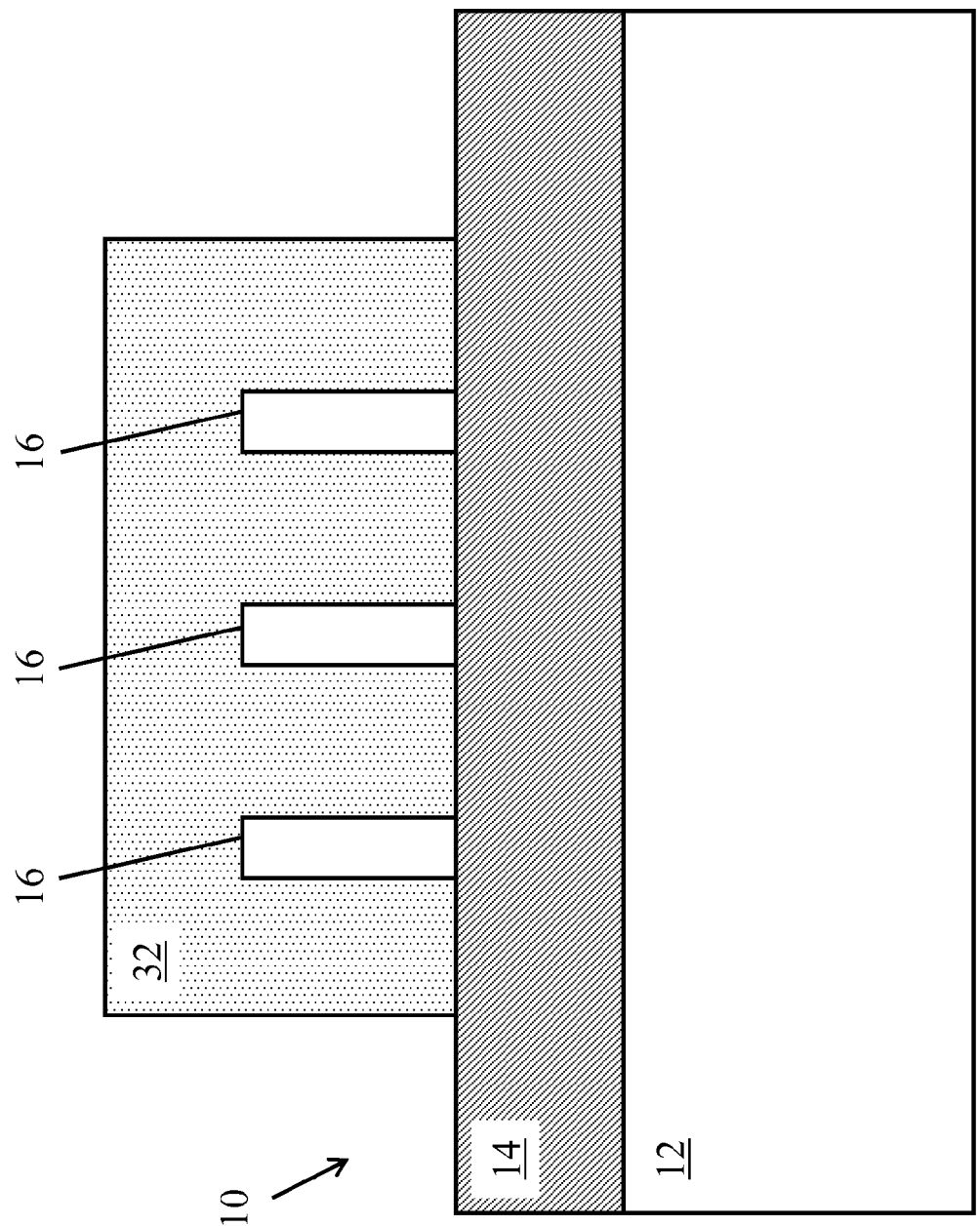

Returning to the previous orientation, a silicon germanium (SiGe) layer 32 can be formed above buried insulator layer 14, as shown in FIG. 3. In embodiments of the disclosed method, SiGe layer 32 can be in contact with one or more semiconductor fins 16. Although SiGe layer 32 is shown by example in FIG. 3 as being a continuous layer in contact with three semiconductor fins 16, it is understood that several SiGe layers 32 can be formed on buried insulator layer 14, with some SiGe layers 32 contacting one semiconductor fin 16, or several semiconductor fins 16. In an embodiment, SiGe layer 32 can be a crystal structure composed of, e.g., approximately fifty percent or more of Ge. In some cases, SiGe layer 32 can be composed of, e.g., at least approximately seventy percent Ge. SiGe layer 32 can be formed on each semiconductor fin 16 by any currently known or later developed process of forming a crystal structure, e.g., epitaxy. Epitaxy can refer to a process in which a thin layer of single-crystal material is deposited onto a surface or substrate, and by way of example herein can include the surface of one or more semiconductor fins 16. Epitaxial growth can cause the crystallographic structure of the substrate to be reproduced in the grown material. In addition, crystalline defects of the substrate are also reproduced in the growing material. Since a single SiGe layer 32 does not need to contact each semiconductor fin 16, the form of growth used does not need to be selective. Thus, both merged and unmerged epitaxial processes can be used to form SiGe layer 32 in embodiments of the present disclosure. Other methods of depositing SiGe can be also used. For example, chemical vapor deposition (CVD), or plasma enhanced chemical vapor deposition (PECVD) can be used to deposit a polycrystalline or amorphous SiGe layer.

Figure 4:
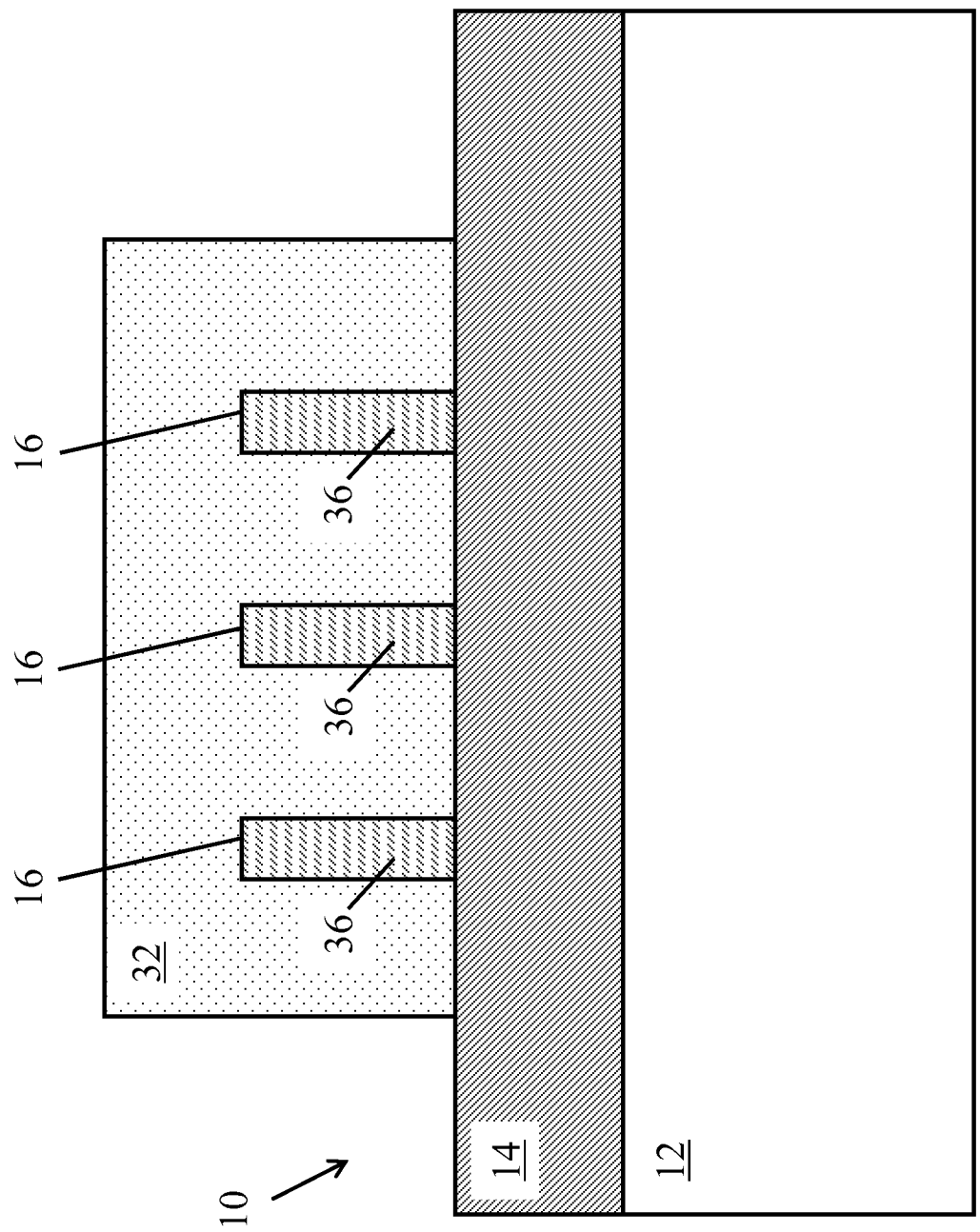

Turning to FIG. 4, another process according to embodiments of the present disclosure is shown. To create a SiGe stressor within the FinFET structure, Ge atoms can migrate by diffusion from SiGe layer 32 into semiconductor fins 16. The introduction of Ge into semiconductor fins 16 introduces compressive stress into semiconductor fins 16. The resulting semiconductor fins 16 thus include a SiGe stressor region 36, having the properties (e.g., conductivity, terminal voltage difference, and other performance variable) of a transistor containing a compressive stressor. SiGe stressor region 36 can have a relatively lower concentration of Ge than SiGe layer 32 (FIGS. 3, 4) as a result of the Ge material therein being provided from diffusion. For example, SiGe stressor region 36 can be composed of, e.g., between approximately twenty percent and forty percent Ge.

The Ge particles can migrate or diffuse into semiconductor fins 16 by heating SiGe layer 32 to a predetermined temperature. For example, the diffusion of Ge from SiGe layer 32 can be a result of annealing SiGe layer 32. "Annealing" generally refers to a heat treatment process in which a structure, such as substrate 12, is subjected to intense heat, and then gradually cooled, in order to modify the physical properties of some or all of the materials and structures present on its surface. The heating of SiGe layer 32 thus causes Ge atoms to diffuse into semiconductor fins 16, thereby creating SiGe stressor region 36. Though SiGe layer 32 may be in contact with other components, e.g., buried insulator layer 14, Ge atoms will only diffuse into semiconductor fins 16 when subjected to heat. The migration of Ge atoms through the outer surface of semiconductor fins 16 can effectively cause the Ge within stressor region 36 to have a "gradient" structure. For example, the highest concentration of Ge within stressor region 36 can be along the exterior of semiconductor fin 16. Conversely, the lowest concentration of Ge can be proximate to gate structure 18, where stressor region 36 is most isolated from SiGe layer 32. To prevent the potential diffusion of Ge atoms into gate structure 18 (FIG. 2), nitride cap 30 (FIG. 2) can effectively block the flow of Ge atoms from SiGe layer 32 into gate structure 18 during the heating process.

Figure 5:
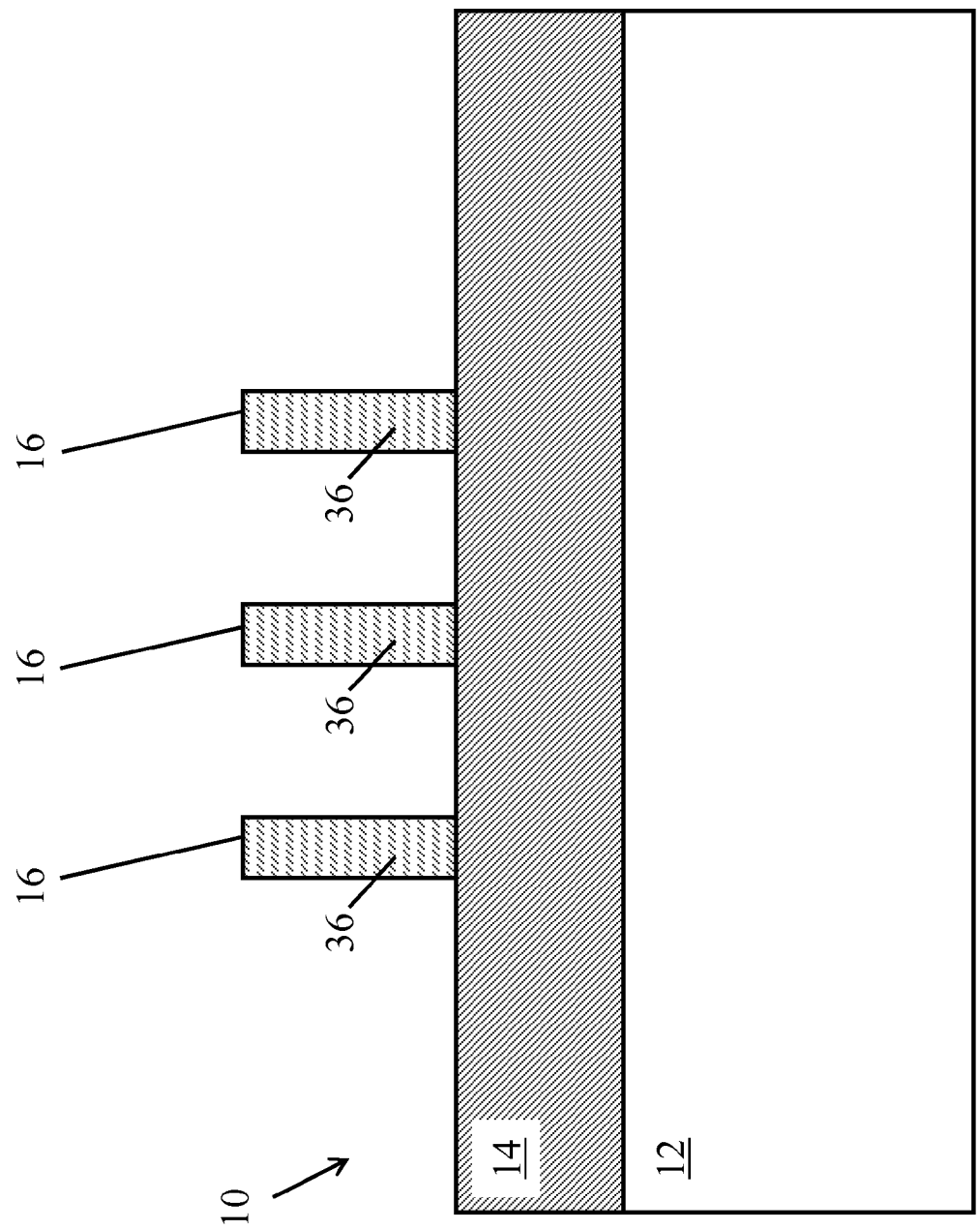
FIG. 5 depicts a cross-sectional view of a FinFET structure according to an embodiment of the present disclosure.

As shown in FIG. 5, SiGe layer 32 (FIGS. 3, 4) can be removed from IC structure 10 following the heating and formation of SiGe stressor region 36. SiGe layer 32 (FIGS. 3, 4) can be removed via any currently known or later developed process of removing a semiconductor component, such as stripping. Since SiGe layer 32 has higher Ge content compared to SiGe stressor region 36, it is possible to selectively remove the SiGe layer 32 without removing the SiGe stressor region 36. For example, SiGe layer 32 (FIGS. 3, 4) can be removed by applying a wet etch using a solution that contains $H_2O_2$, such as a $H_2O_2$:$NH_4OH$:$H_2O$ solution, to SiGe layer 32 (FIGS. 3, 4). In addition or alternatively, SiGe layer 32 (FIGS. 3, 4) can be contacted with a gas capable of stripping or otherwise removing SiGe layer 32 (FIGS. 3, 4) from IC structure 10, such as gaseous hydrogen chloride (HCl). In each case, the etch rate of SiGe layer 32 is a function of the Ge content, making it possible to remove SiGe layer 32 selectively without removing portions of SiGe stressor region 36. Although each SiGe stressor region 36 is shown by example in FIG. 5 as being approximately the same size as semiconductor fins 16, it is understood that the removing of SiGe layer 32 (FIGS. 3, 4) can affect the size of SiGe stressor region 36 without substantially influencing its properties. For example, the removing of SiGe layer 32 (FIGS. 3, 4) can partially remove or strip away the surface of SiGe stressor region 36, thus decreasing its size. As another example, some particles from SiGe layer (FIGS. 3, 4) may remain on the outer surface of SiGe stressor region 36, increasing the size of SiGe stressor region 36 but not influencing its properties during operation of IC structure 10.

Figure 6:
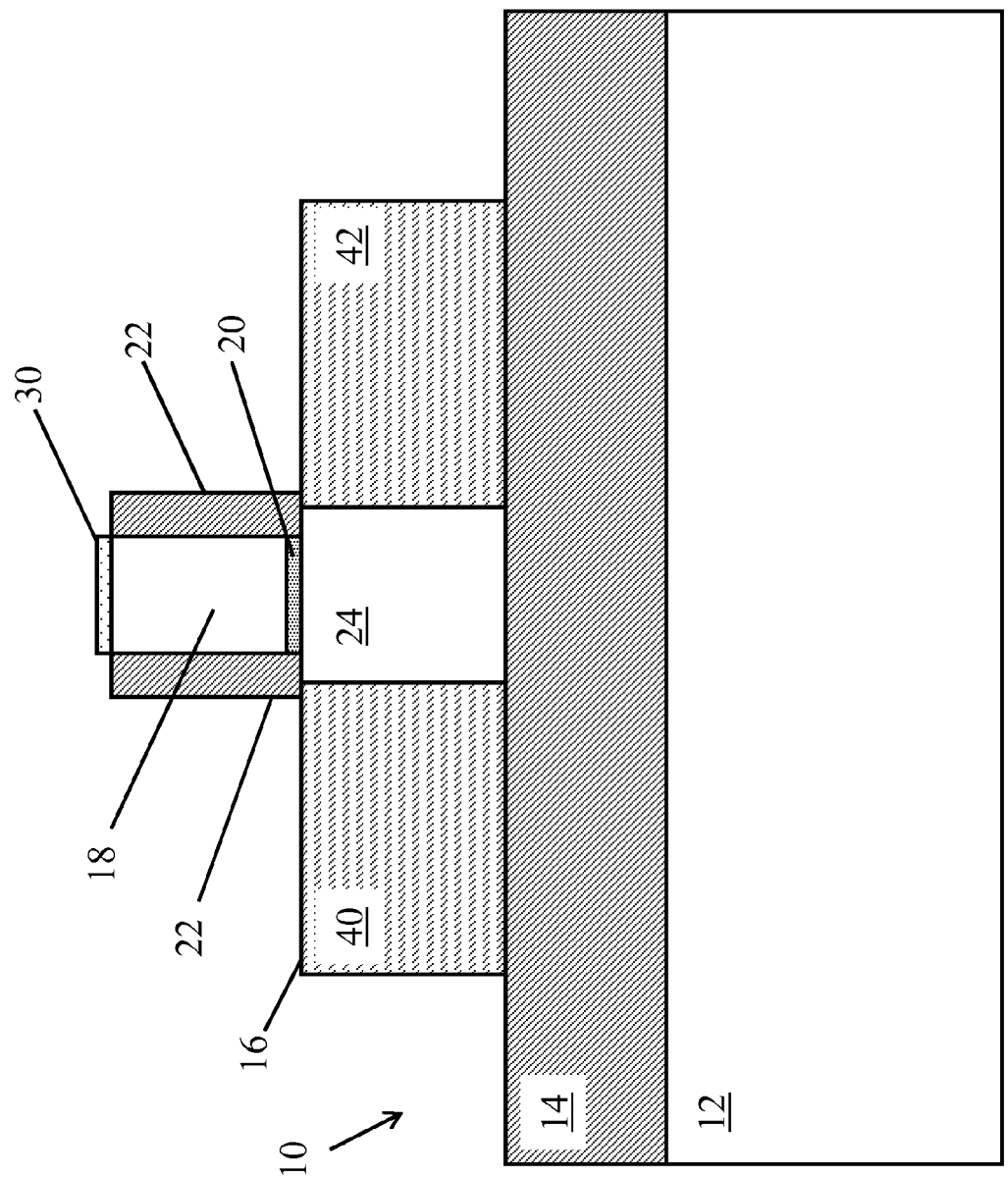
FIG. 6 depicts a channel-oriented cross-sectional view of a FinFET structure according to an embodiment of the present disclosure.

FIG. 6 provides a channel-oriented, cross-sectional view of an IC structure 10, with a FinFET structure thereon, according to an embodiment of the disclosure. As shown in FIG. 6, semiconductor fin 16 can include a first SiGe source region 40 and a SiGe drain region 42. Channel region 24, however, may have no substantial concentration of Ge therein as a result of being substantially isolated from contact with SiGe layer 32 (FIGS. 3, 4). As also described herein, gate structure 18 can be positioned above semiconductor fin 16, optionally with gate dielectric 20 being positioned therebetween. Spacers 22 can also be positioned alongside gate structure 18 to effectively block the flow of electric current from gate structure 18 into each region semiconductor fin 16 during operation. Further, gate structure 18 may be an inoperable "dummy structure," which can be removed and replaced with a conductive gate material in a later fabrication process or step. IC structure 10, including the various FinFET components, can be obtained embodiments of a method according to the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method of forming a FinFET with a silicon germanium (SiGe) stressor, the method comprising:
    forming a semiconductor fin on a buried insulator layer;
    forming a gate structure on a portion of the semiconductor fin;
    forming a silicon germanium (SiGe) layer on a remaining portion of the semiconductor fin, following the forming of the gate structure, wherein the formed SiGe layer directly contacts the semiconductor fin; and
    heating the SiGe layer, wherein the heating diffuses germanium (Ge) into the semiconductor fin to form a SiGe stressor region.

2. The method of claim 1, further comprising removing the SiGe layer from the buried insulator layer after the heating of the SiGe layer.

3. The method of claim 1, wherein the removing includes one of applying a wet etching process and contacting the SiGe layer with a stripping gas.

4. The method of claim 1, wherein the forming of the semiconductor fin includes etching a fin geometry from a bonded semiconductor wafer.

5. The method of claim 1, further comprising removing the gate structure and forming a transistor gate on the portion of the semiconductor fin, after the heating of the SiGe layer.

6. The method of claim 1, further comprising forming a spacer on the gate structure, wherein the spacer prevents the flow of Ge atoms from the SiGe layer into the gate structure, during the heating.

7. The method of claim 1, wherein the formed SiGe layer is composed of at least 50% Ge.

8. The method of claim 1, wherein the formed SiGe layer is composed of at least 70% Ge.

9. The method of claim 1, wherein the forming of the SiGe layer includes growing the SiGe layer on the semiconductor fin.

10. The method of claim 9, wherein the growing includes one of merged epitaxy and unmerged epitaxy.

11. The method of claim 1, further comprising forming a nitride cap on the gate structure, wherein the nitride cap prevents the flow of Ge atoms from the SiGe layer into the gate structure, during the heating.

12. The method of claim 1, further comprising forming a gate dielectric between the gate structure and the semiconductor fin.

13. A FinFET structure with a silicon germanium (SiGe) stressor, the FinFET structure comprising:
   a semiconductor fin positioned above a buried insulator layer, wherein the semiconductor fin includes:
      a semiconductor channel region;
      a first SiGe source region positioned adjacent to the semiconductor channel region; and
      a SiGe drain region positioned adjacent to the semiconductor channel region;
   wherein each of the SiGe source region and SiGe drain region each comprise stressors of the FinFET structure, each stressor having a highest concentration of Ge along an exterior of the semiconductor fin, and a lowest concentration of Ge proximate to the semiconductor channel region.

14. The FinFET structure of claim 13, wherein one of the SiGe source region and the SiGe drain region is composed of between approximately 20% germanium (Ge) and approximately 40% Ge.

15. The FinFET structure of claim 13, further comprising a gate structure positioned above the semiconductor fin.

16. The FinFET structure of claim 15, further comprising at least one spacer positioned alongside the gate structure, wherein the at least one spacer is composed of an insulative material.

17. The FinFET structure of claim 15, wherein the gate structure comprises one of a dummy gate and an electrically conductive gate.

18. The FinFET structure of claim 15, further comprising a gate dielectric positioned between the semiconductor fin and the gate structure.

19. The FinFET structure of claim 15, wherein the FinFET structure is formed by:
   forming the semiconductor fin on the buried insulator layer;
   forming the gate structure on a portion of the semiconductor fin;
   forming a silicon germanium (SiGe) layer on a remaining portion of the semiconductor fin, following the forming of the gate structure, wherein the formed SiGe layer directly contacts the semiconductor fin; and
   heating the SiGe layer, wherein the heating diffuses germanium (Ge) into the semiconductor fin to form a SiGe stressor region.

20. A method of forming a FinFET structure, the method comprising:
   forming a semiconductor fin on a buried insulator layer, wherein the semiconductor fin includes a source region and a drain region;
   forming a gate structure on the semiconductor fin;
   forming a spacer on the gate structure;
   growing a SiGe layer on the buried insulator layer, wherein the SiGe layer contacts the semiconductor fin not covered by the gate structure;
   annealing the SiGe layer, wherein the annealing causes germanium (Ge) to diffuse from the SiGe layer into the semiconductor fin at each of the source region and the drain region to form two SiGe stressor regions; and
   removing the SiGe layer.

* * * * *